(12) United States Patent
Hammi

(10) Patent No.: US 9,172,334 B2
(45) Date of Patent: Oct. 27, 2015

(54) DIGITAL PREDISTORTION SYSTEM AND METHOD WITH EXTENDED CORRECTION BANDWIDTH

(71) Applicant: KING FAHD UNIVERSITY OF PETROLEUM AND MINERALS, Dhahran (SA)

(72) Inventor: Oualid Hammi, Dhahran (SA)

(73) Assignee: KING FAHD UNIVERSITY OF PETROLEUM AND MINERALS, Dhahran (SA)

(*) Notice: Subject to any disclaimer, the term of this patent is extended or adjusted under 35 U.S.C. 154(b) by 0 days.

(21) Appl. No.: 14/537,843

(22) Filed: Nov. 10, 2014

(65) Prior Publication Data

US 2015/0061774 A1 Mar. 5, 2015

Related U.S. Application Data

(63) Continuation-in-part of application No. 14/522,508, filed on Oct. 23, 2014, and a continuation-in-part of application No. 13/891,134, filed on May 9, 2013, now abandoned.

(51) Int. Cl.
| | |
|---|---|
| H03F 1/32 | (2006.01) |
| H03F 3/21 | (2006.01) |
| H03F 3/19 | (2006.01) |
| H03F 1/02 | (2006.01) |
| H04B 1/04 | (2006.01) |

(52) U.S. Cl.
CPC ............ *H03F 1/3247* (2013.01); *H03F 1/0288* (2013.01); *H03F 1/3258* (2013.01); *H03F 3/19* (2013.01); *H03F 3/21* (2013.01); *H04B 1/0475* (2013.01); *H03F 2200/451* (2013.01); *H03F 2201/3215* (2013.01); *H04B 2001/045* (2013.01); *H04B 2001/0425* (2013.01)

(58) Field of Classification Search
CPC ....... H03F 1/3247; H03F 1/3258; H03F 3/21; H03F 3/19; H03F 2201/3215; H03F 2200/451; H03F 2201/3224; H03F 2201/3233; H03F 1/304; H03F 2201/3209; H03F 2201/32153
See application file for complete search history.

(56) References Cited

U.S. PATENT DOCUMENTS

| | | | | |
|---|---|---|---|---|
| 6,798,843 | B1* | 9/2004 | Wright et al. | 375/296 |
| 8,553,791 | B1 | 10/2013 | McCloskey et al. | |
| 8,615,208 | B2* | 12/2013 | McCallister et al. | 455/127.1 |
| 8,737,523 | B2* | 5/2014 | Barnes | H03F 1/3247 375/296 |
| 2004/0179629 | A1* | 9/2004 | Song et al. | 375/296 |
| 2004/0247042 | A1* | 12/2004 | Sahlman | 375/297 |
| 2005/0190857 | A1* | 9/2005 | Braithwaite | 375/296 |
| 2006/0012427 | A1* | 1/2006 | Nezami | 330/149 |

(Continued)

OTHER PUBLICATIONS

Hammi et al., "Augmented Twin-Nonlinear Two-Box Behavioral Models for Multicarrier LTE Power Amplifiers," The Scientific World Journal, Jan. 2014.

*Primary Examiner* — Hirdepal Singh
(74) *Attorney, Agent, or Firm* — Richard C. Litman

(57) ABSTRACT

The digital predistortion system and method with extended correction bandwidth includes a predistortion system that uses a two-box architecture based on the cascade of a memory polynomial followed by a memoryless predistortion function. The memoryless predistorter is identified offline and used to perform a coarse linearization which cancels out most of the static nonlinearity of the device under test allowing for a reduced observation bandwidth for the synthesis of the memory polynomial predistortion sub-function.

16 Claims, 12 Drawing Sheets

(56) References Cited

U.S. PATENT DOCUMENTS

| | | | |
|---|---|---|---|
| 2008/0152037 A1* | 6/2008 | Kim et al. | 375/297 |
| 2012/0119811 A1* | 5/2012 | Bai et al. | 327/317 |
| 2014/0139286 A1* | 5/2014 | Laporte | H03F 1/3247 |
| | | | 330/149 |
| 2014/0211882 A1* | 7/2014 | Zhao | H04L 27/368 |
| | | | 375/296 |
| 2014/0241461 A1* | 8/2014 | Kim | H04B 1/0475 |
| | | | 375/297 |

* cited by examiner

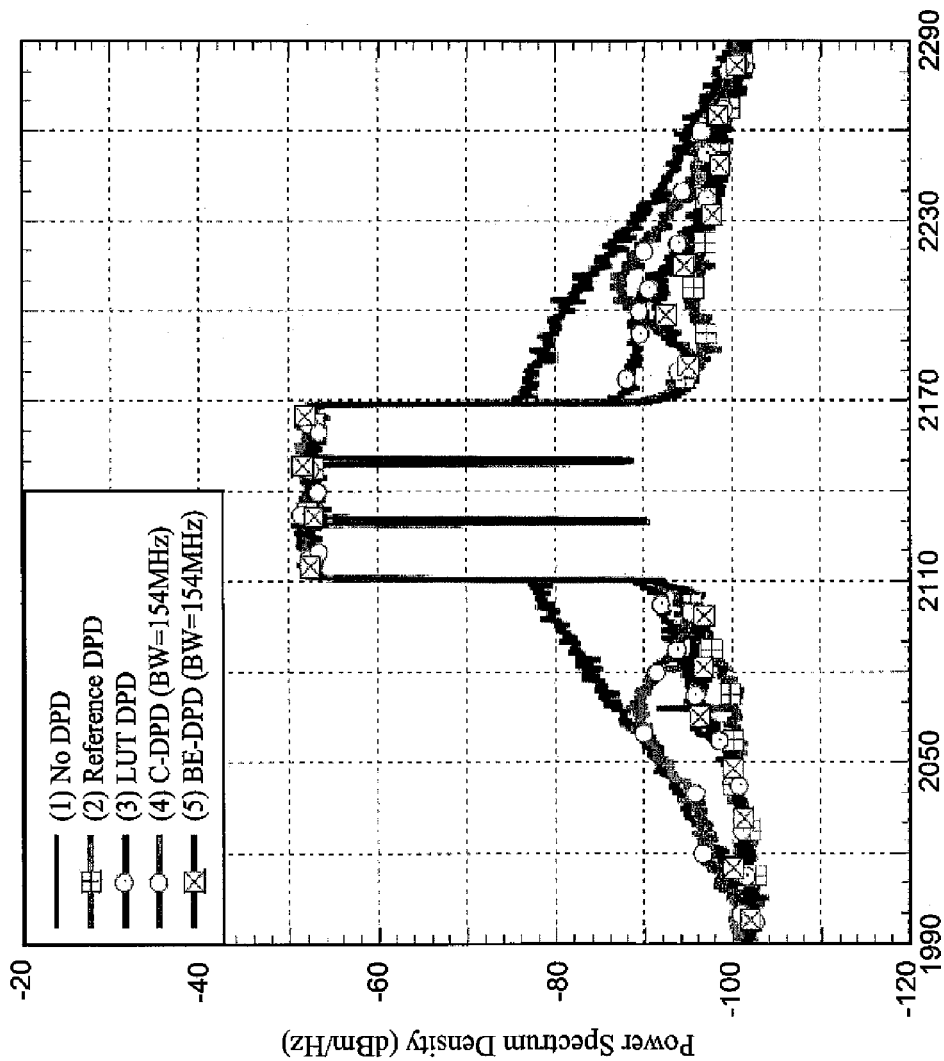

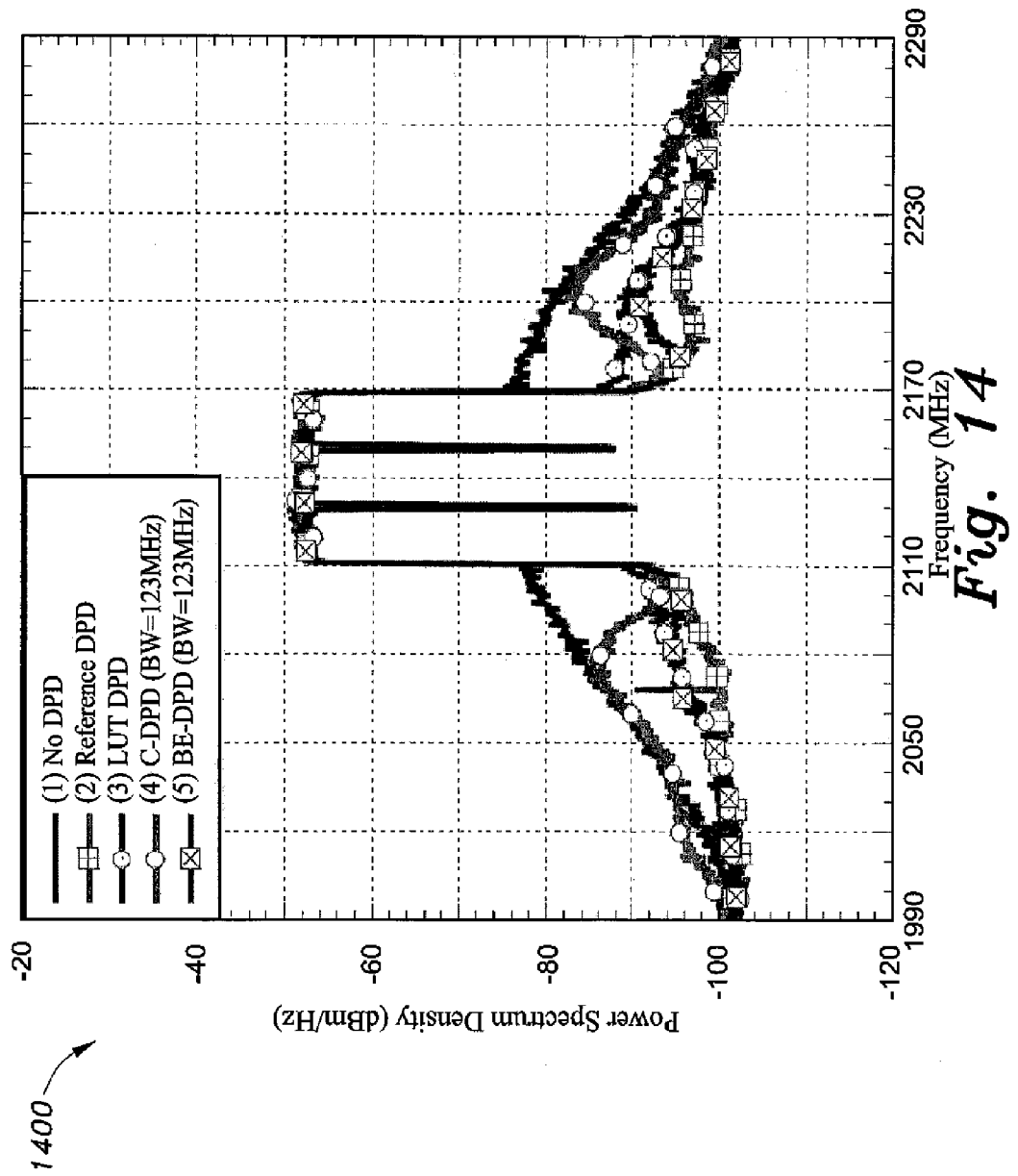

DIGITAL PREDISTORTION SYSTEM AND METHOD WITH EXTENDED CORRECTION BANDWIDTH

CROSS-REFERENCE TO RELATED APPLICATION

This application is a continuation-in-part of U.S. patent application Ser. No. 14/522,508, filed on Oct. 23, 2014 which is a continuation-in-part of U.S. patent application Ser. No. 13/891,134, filed on May 9, 2013.

BACKGROUND OF THE INVENTION

1. Field of the Invention

The present invention relates to telecommunication systems, and particularly to a digital predistortion system and method with extended correction bandwidth.

2. Description of the Related Art

Radio frequency power amplifiers (PAs) are the main cause of nonlinearities in wireless transmitters. These nonlinearities appear as a result of using spectrum efficient modulation and multiplexing techniques such as multi-level quadrature amplitude modulation (QAM) and orthogonal frequency division multiplexing (OFDM), respectively. These techniques widely used in modern communication systems inevitably lead to amplitude modulated time domain signals with high peak-to-average power ratios (PAPR). To ensure power efficient operation of the power amplification stage, architectures such as Doherty amplifiers and polar transmitters are adopted.

These power amplification circuits enhance the power efficiency while resulting in a substantially nonlinear behavior. In fact, the signal's amplitude modulation emulates the static nonlinear behavior of PAs. Moreover, dynamic distortions caused by the electrical memory effects will be induced due to the wide bandwidth of the signals to be transmitted. This calls for the use of linearization circuitry along with the power amplifier to reduce the spectral regrowth in the adjacent channels. Digital predistortion technique is the preferred choice for the linearization of base station power amplifiers. Several predistortion structures have been proposed to compensate for the dynamic nonlinear behavior of power amplifiers driven by wideband signals.

Digital predistortion is achieved by placing before the amplifier a complementary nonlinear function that will cancel out the distortions created by the PA. The performance of the digital predistorter heavily depends on the match between the predistortion function and the inverse characteristic of the PA. Accordingly, accurate characterization of the device under test is needed. This sets stringent bandwidth requirements since the signal at the output of a power amplifier is typically five times wider than the original signal to be transmitted. In a first attempt to address the wide bandwidth requirement of digital predistortion systems, a band-limited approach consisting of filtering the PA's output signal to limit the required observation bandwidth and applying a similar bandwidth limitation on the predistorted signal through filtering was investigated. This led to satisfactory linearization performance in the observation bandwidth but with no distortions correction beyond the observation bandwidth of the system. Recently, a DPD system was able to reduce the spectrum regrowth over a bandwidth that exceeds the observation bandwidth. This is obtained by filtering the PA's output signal to alleviate the speed requirements on the analog to digital converters (ADC). The filtered spectral components are then recovered in the digital domain by using spectral extrapolation techniques which add significant computational complexity to the predistortion system. Yet there remains the problem of how to reduce the spectral regrowth over a bandwidth that exceeds the observation bandwidth and the problem of how to avoid major additional computational overhead.

Thus, a digital predistortion system and method with extended correction bandwidth solving the aforementioned problems is desired.

SUMMARY OF THE INVENTION

The digital predistortion system and method with extended correction bandwidth is a predistortion system using a two box architecture based on the cascade of a memory polynomial followed by a memoryless predistortion function. The memoryless predistorter is identified offline and used to perform a coarse linearization which cancels out most of the static nonlinearity of the device under test allowing for a reduced observation bandwidth for the synthesis of the memory polynomial predistortion sub-function.

These and other features of the present invention will become readily apparent upon further review of the following specification and drawings.

BRIEF DESCRIPTION OF THE DRAWINGS

FIG. 13 is a plot showing measured spectra at the output of the linearized DUT using C-DPD and BE DPD for 154 MHz observation bandwidth.

FIG. 14 is a plot showing measured spectra at the output of the linearized DUT for 123 MHz observation bandwidth.

Similar reference characters denote corresponding features consistently throughout the attached drawings.

DETAILED DESCRIPTION OF THE PREFERRED EMBODIMENTS

Figure 1:
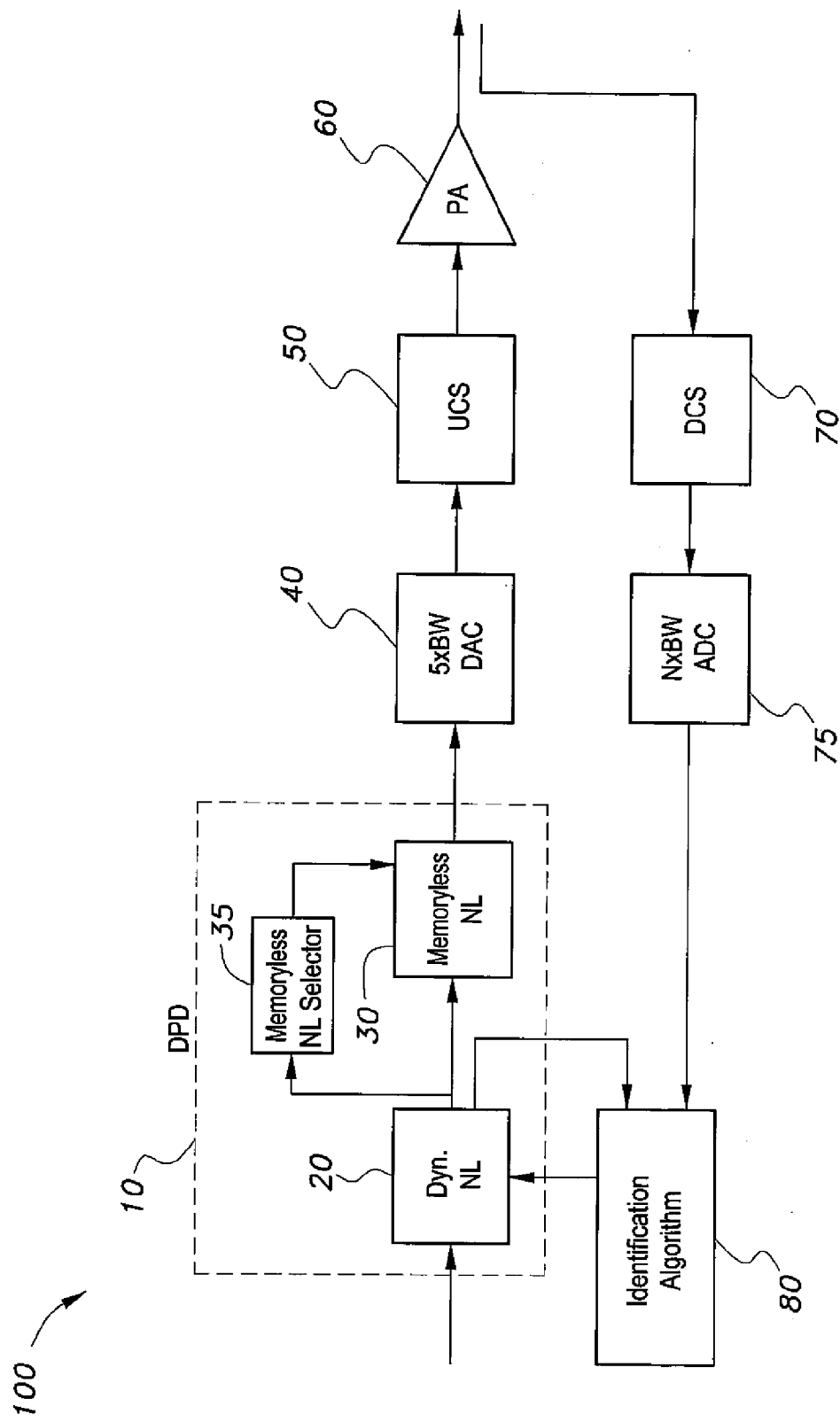
FIG. 1 is a block diagram of the digital predistortion system with extended correction bandwidth according to the present invention.

The digital predistortion system with extended correction bandwidth is a predistortion system using a two box architecture based on the cascade of a memory polynomial followed by a memoryless predistortion function. The memoryless predistorter is identified offline and used to perform a coarse linearization which cancels out most of the static nonlinearity of the device under test allowing for a reduced observation bandwidth for the synthesis of the memory polynomial predistortion sub-function.

Two and three-box based digital predistorters have been widely investigated in the literature for the linearization of power amplifiers exhibiting memory effects. The basic idea is that the nonlinearity order of the power amplifier is split into two lower order nonlinear functions. In fact, the cascade of two polynomial functions with nonlinearity orders $K_1$ and $K_2$ respectively, will result in a nonlinear system with nonlinear terms up to the $K_1 \times K_2$ order while requiring only $K_1 + K_2$ coefficients. Accordingly, multi-box models demonstrated similar and even superior performance compared to single box models while requiring a lower number of coefficients. When memory effects are present, a common approach consists in using a memoryless nonlinear function, that is optimized to compensate for the highly nonlinear memoryless characteristic of the device under test, and a dynamic function that compensates for the residual dynamic distortions of the DUT. The dynamic function is a linear filter in Wiener based predistorters, and a low order memory polynomial function in twin-nonlinear two-box models.

The two-box digital predistorter considered in this work includes a cascade of a dynamic nonlinear function followed by a memoryless nonlinearity. The output signal of the dynamic nonlinearity block ($x_{interm}$) is built using an exemplary memory polynomial function given by:

$$x_{interm}(i) = \sum_{n=0}^{N} \sum_{m=0}^{M} a_{nm} x(i-m) |x(i-m)|^n \quad (1)$$

where N and M are the nonlinearity order and the memory depth of the memory polynomial function used to implement the dynamic nonlinearity of the predistorter, respectively.

Similarly, the output signal ($x_{out\_DPD}$) of the memoryless nonlinear predistorter may be formulated according to exemplary relation:

$$x_{out\_DPD}(i) = \sum_{k=0}^{K} b_k x_{interm}(i) |x_{interm}(i)|^k \quad (2)$$

where K refers to the nonlinearity order of the memoryless nonlinearity sub-block of the proposed digital predistorter. It should be understood that alternative memory polynomial functions may be used to build the output signal of the dynamic nonlinearity block ($x_{interm}$). For example, the output signal ($x_{interm}$) may be built using a memory polynomial function given by:

$$x_{interm}(i) = \sum_{n=0}^{N} \sum_{m=0}^{M} a_{nm} x(i) |x(i-m)|^n, \text{ or by:} \quad (3)$$

$$x_{interm}(i) = \sum_{n=0}^{N} \sum_{m=0}^{M} a_{nm} x(i-m) |x(i-m)|^n + \sum_{n=1}^{N_e} \sum_{m=1}^{M_e} b_{nm} x(i) |x(i-m)|^n, \quad (4)$$

where N and M are the nonlinearity order and the memory depth of the first term of the memory polynomial function used to implement the dynamic nonlinearity of the predistorter, respectively. $N_e$ and $M_e$ are the nonlinearity order and the memory depth of the second term of the memory polynomial function used to implement the dynamic nonlinearity of the predistorter, respectively. Alternatively, the output signal ($x_{interm}$) may be built using a memory polynomial function given by:

$$x_{interm}(i) = \sum_{n=0}^{N} \sum_{m=0}^{M} a_{nm} x(i-m) |x(i-m)|^n + \quad (5)$$
$$\sum_{n=1}^{N_b} \sum_{m=0}^{M_b} \sum_{p=1}^{P} b_{nmp} x(i-m) |x(i-m-p)|^n +$$
$$\sum_{n=1}^{N_c} \sum_{m=0}^{M_c} \sum_{q=1}^{Q} c_{nmq} x(i-m) |x(i-m+q)|^n,$$

where N and M are the nonlinearity order and the memory depth of the first term of the memory polynomial function used to implement the dynamic nonlinearity of the predistorter, respectively. $N_b$ and $M_b$ are the nonlinearity order and the memory depth of the second term of the memory polynomial function used to implement the dynamic nonlinearity of the predistorter, respectively. $N_c$ and $M_c$ are the nonlinearity order and the memory depth of the third term of the memory polynomial function used to implement the dynamic nonlinearity of the predistorter, respectively. P and Q are the orders of the lagging and leading cross-terms of the memory polynomial function used to implement the dynamic nonlinearity of the predistorter, respectively.

In general, the digital output signal ($x_{out\_DPD}$) of the memoryless nonlinear predistorter is characterized by the relation:

$$x_{out\_DPD}(i) = x_{interm}(i) \cdot G(|x_{interm}(i)|), \quad (6)$$

where G refers to the complex gain of the memoryless nonlinear predistorter-block.

Substituting the output signal of the dynamic nonlinearity block ($x_{interm}$) into the output signal ($x_{out\_DPD}$) of the memoryless nonlinear predistorter will relate the predistorter's output signal ($x_{out\_DPD}$) to its input signal ($x_{in}$). Such a predistorter is built according to the reverse twin-nonlinear two-box structure reported in the prior art. However, the procedure used to identify the DPD coefficients in the present invention is very distinct from that of the original reverse twin-nonlinear two-box. This major difference enhances the bandwidth capability of the present digital predistortion system with extended correction bandwidth, as it will be detailed infra. Separating the memoryless part (static nonlinearity) of the predistorter from its memory effects (dynamic nonlinearity) is a very attractive feature of the present DPD system shown in FIG. 1. Indeed, it was shown in the prior art literature that the static distortion of the PA are more accurately characterized under narrow band test condition. This implies that the static nonlinearity of two-box digital predistorter structures can be derived from narrow band measurements.

The specific cascaded arrangement of the present digital predistortion system with extended correction bandwidth is suitable for implementing a two-step linearization process where the static nonlinear function of the DPD is first applied, and then the dynamic nonlinear function of the predistorter is synthesized to linearize the cascade which is comprised of, but not limited to, the memoryless DPD (static nonlinear function), and the device under test, i.e., in addition to the memoryless DPD and device under test, components in the cascade may include, for example, a digital to analog converter (DAC) and a frequency up-conversion stage (UCS). The linearization is achieved by using the signal ($x_{interm}$) at the input of the static nonlinearity function and a portion of the output of the device under test to identify the dynamic nonlinear predistortion function.

Furthermore, a closer look at the output spectra of the power amplifier before linearization, and after applying the memoryless DPD (built using the static nonlinearity function of the two-box DPD) reveals valuable information about the typical behavior of power amplifiers. Indeed, there exists significant impact of using a memoryless predistorter and a full two-box predistorter on the spectra at the output of the linearized amplifier. When only the static nonlinearity of the two-box DPD structure is applied to linearize the PA, substantial spectrum regrowth cancellation will be observed even if the amplifier exhibits strong memory effects. Most importantly, it is anticipated that the signal bandwidth at the output of the PA linearized using a memoryless DPD will be narrower than that obtained at the output of the PA without any predistortion. In fact, the static distortions are known to be highly nonlinear while memory effects are linear or at most mildly nonlinear. Thus, when the static nonlinearity of the DUT is cancelled out by the memoryless DPD function, the bandwidth of the signal at the output of the PA will decrease. Consequently, the bandwidth of the feedback path and thus the ADC speed requirements can be reduced accordingly without compromising the quality of the linearization.

With respect to conventional digital predistortion systems, in the signal generation path, the signal to be transmitted ($x_{in}$) is first predistorted. The resulting signal at the output of the DPD is then converted by a digital to analog converter (DAC) before being upconverted by a frequency up-conversion stage (UCS). In the signal feedback path, a portion of the signal at the output of the power amplifier ($x_{out\_PA}$) is down-converted by a frequency down-conversion stage (DCS), and then digitized by an analog to digital converter (ADC). In such a system, it is important to define the following parameters that are of primary interest in this work, i.e., signal bandwidth refers to the bandwidth of the signal to be transmitted which is applied at the input of the predistorter. DPD correction bandwidth refers to the signal bandwidth at the output of the PA over which a spectrum regrowth reduction is observed following the use of the DPD. Signal generation bandwidth refers to the bandwidth of the signal applied at the input of the digital to analog converter in the signal generation path. Signal observation bandwidth corresponds to the bandwidth of the signal at the input of the analog to digital converter in the signal feedback path.

Usually, the spectrum regrowth observed at the output of power amplifiers spans over a bandwidth five times wider than that of the input signal. Thus, if the signal bandwidth is BW, then the DPD correction bandwidth should be 5×BW. To ensure such DPD correction bandwidth, conventional DPD systems require the signal generation bandwidth as well as the signal observation bandwidth to be equal to the DPD correction bandwidth, that is 5×BW. With the adoption of wideband multi-carrier communication signals as it is the case in the LTE-A standard, digitally predistorted power amplifiers should be able to handle broadband input signal bandwidths obtained through carrier aggregation of a plurality of 20 MHz wide signals. Even though LTE-A signals can have bandwidths as wide as 100 MHz, bandwidths beyond 60 MHz are commonly obtained through carrier aggregation between several frequency bands since typical frequency bands are only 60 MHz wide (for example the 1930 MHz to 1990 MHz, or the 2110 MHz to 2170 MHz frequency bands). Where the focus is mainly on single band power amplifier predistortion, the maximum input signal bandwidth that will be considered is limited to approximately 60 MHz. In such case, the DPD correction bandwidth should be 300 MHz wide. Consequently, the speed of the digital to analog converter as well as the analog to digital converter used must be commensurate to this correction bandwidth (300 MHz). For these ADC and DAC, the wide bandwidth constraint adds up to the dynamic range specifications required to ensure satisfactory adjacent channel performance of the linearized amplifier. This limits the correction bandwidth of state of the art digital predistortion systems as well as commonly used experimental setups to approximately 160 MHz. This bandwidth translates into a signal bandwidth in the range of 30 MHz which is not sufficient for LTE-A systems.

Based on the above discussion, the conventional DPD system has been modified to implement the present digital predistortion system with extended correction bandwidth shown in FIG. 1. Herein, extended correction bandwidth refers to the fact that the DPD correction bandwidth exceeds its observation bandwidth as experimentally validated. As shown in FIG. 1, the present extended bandwidth DPD system includes DPD 10 comprised of a dynamic nonlinear block 20 having an output connected to a memoryless nonlinearity selector block which feeds a select input to memoryless, offline determinable, nonlinear predistorter block 30. The output of dynamic nonlinear block 20 feeds a signal input of memoryless, offline determinable, nonlinear predistorter block 30 which has an output feeding digital-to-analog converter (DAC) 40, the DAC 40 having a sampling rate that allows for the accurate conversion of a signal having a bandwidth of at least 5×BW. The output of DAC 40 feeds frequency up-conversion stage (UCS) 50 which then feeds the power amplifier (PA) 60. Portion of amplifier output is then fed to DCS 70 which feeds ADC 75 (having a sampling rate allowing for the observation of at least N×BW where N<5). The ADC 75 then feeds an identification algorithm 80, (e.g., a processor running MATLAB wherein the algorithm 80 is executed), which in turn tunes the dynamic nonlinear predistorter block 20 of DPD 10.

Figure 2:
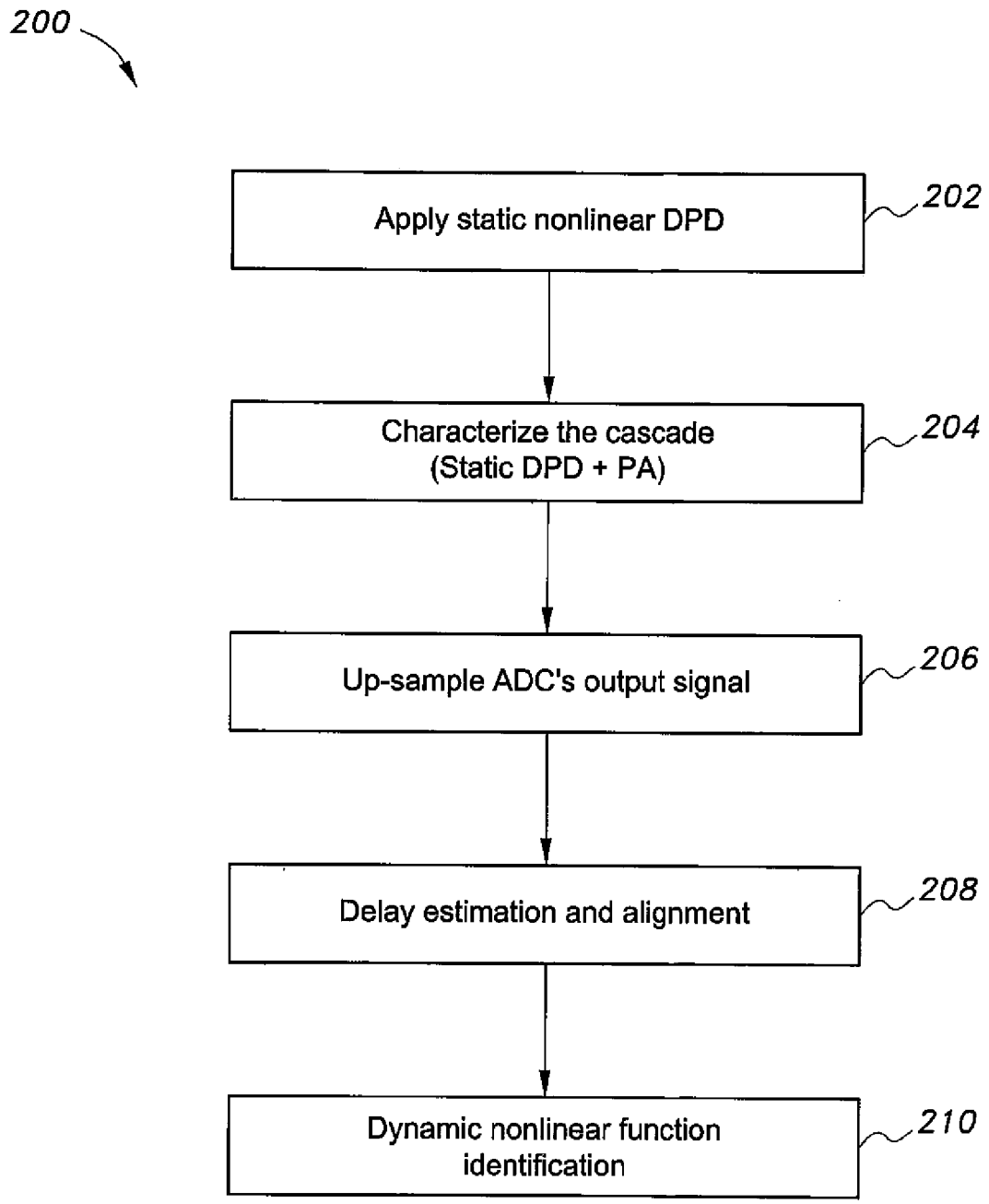
FIG. 2 is a flowchart of the DPD algorithm according to the present invention.

Referring to the flowchart of FIG. 2, the DPD method 200 of the present digital predistortion system with extended correction bandwidth 100 has steps that include applying static nonlinear DPD 202, characterizing the cascade (Static DPD and PA) 204, the cascade including the blocks between the Static DPD and PA (as shown in FIG. 1), up-sampling ADC's output signal 206, performing a delay estimation and alignment 208 and performing a dynamic nonlinear function identification 210. Steps 206, 208 and 210 are implemented in the identification algorithm 80 of FIG. 1. The digital predistortion is performed in two successive phases. First, the memoryless DPD synthesized from narrow band measurements is applied. Then, the input of the static nonlinear predistortion function and the output of the PA are used by the DPD identification algorithm to build the dynamic nonlinearity compensation function. Thus, the system to be linearized in the second predistortion step is the cascade of the memoryless DPD function and the PA as well as the DAC and UCS block of FIG. 1. As explained above, this system is a mildly nonlinear dynamic system that has memory effects comparable to that of the PA but significantly less static distortions. This contrasts with the highly nonlinear dynamic system being linearized in the conventional DPD architecture which is the PA itself. In other words, by using the memoryless nonlinear function, the system to be linearized is changed from being a highly nonlinear dynamic system (in the conventional DPD case) to a mildly nonlinear dynamic system (in the present extended bandwidth DPD) while the PA remains unchanged. Based on this, a lower sampling rate can be used in the analog to digital converter of the feedback path since the signal at its input has a bandwidth denoted N×BW with N<5.

In the present digital predistortion system with extended correction bandwidth 100, two considerations need to be addressed: the synthesis of the static nonlinear DPD 30, and the unequal sampling rates of the signals fed to the dynamic distortions DPD identification algorithm block 80.

The static nonlinear function of the DPD is built in order to compensate for the memoryless distortions of the power amplifier 60. Since these distortions can be characterized from narrow band measurements and are primarily a function of the input signal's average power, it is possible to pre-synthesize these offline. For example, the static nonlinear DPD (memoryless NL block 30) can be made of several memoryless polynomial functions or look-up tables indexed by the operating average power of the input signal (the average power of the input signal, for example, being determinable by calculating a sum of the power over n discrete samples and dividing that sum by n). Thus, the input signal of the static nonlinear predistorter is also fed to a static nonlinearity selector, e.g., memoryless NL selector 35 which calculates the signal average power and uses it to select a memoryless polynomial function or look-up table among the plurality of functions pre-loaded in memoryless nonlinear (NL) predistorter block 30. The input to the memoryless, (preferably offline determinable), nonlinear predistorter 30 is comprised of dynamic nonlinear predistorter 20 and is applied to the memoryless nonlinear selector 35, output of which selects a memoryless function stored in the memoryless nonlinear predistorter 30 to generate the predistorter output signal that is fed to the DAC 40. Furthermore, the architecture of the present DPD is robust to mismatches between the static nonlinearity of the DPD and the actual memoryless distortions of the PA since the dynamic nonlinear function 20 of the predistorter will compensate for any residual nonlinearities present in the cascaded system made of the PA and the DPD's static nonlinear function.

The signal at output of the feedback path's ADC 75 has a sampling rate lower than that of the signal at the input of the memoryless, offline determinable, nonlinear predistorter 30. Since both signals are used to identify the dynamic nonlinear function of the DPD in identification algorithm 80, equal sampling rates are needed. To overcome this issue, the first step of the dynamic predistorter identification algorithm performs an oversampling of the ADC's output signal to have coherent sampling rates for both signals used to identify the dynamic distortions function of DPD 10.

First, the static nonlinear predistortion function derived from offline narrowband measurements is applied. Then, the input and output baseband waveforms of the cascade made of the static DPD and the PA as well as the transmitter blocks in-between are acquired. The ADC's output signal is then up-sampled to the same sampling frequency as the input signal of the static DPD. The up-sampled ADC's output signal and the static DPD input signal are time aligned and then used to derive the coefficients of the dynamic nonlinear predistortion block.

Figure 3:
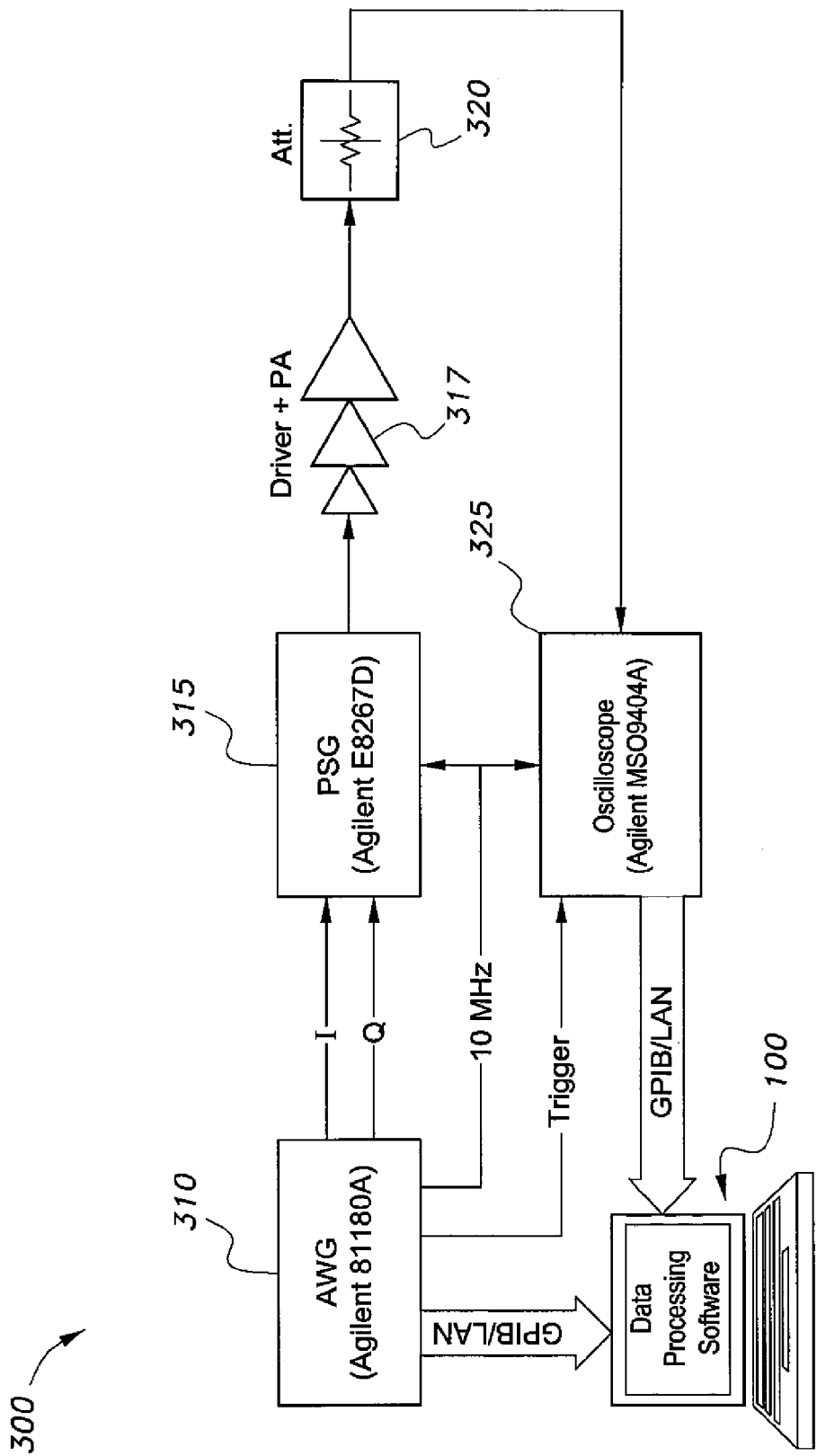
FIG. 3 is a block diagram showing an experimental setup testing the effectiveness of the digital predistortion system with extended correction bandwidth according to the present invention.

The experimental validation was carried using a 3-carrier LTE-A signal having a total bandwidth of 60 MHz and a peak to average power ratio of 10.4 dB at a complementary cumulative distribution function (CCDF) of 0.001%. To validate the present extended bandwidth DPD system 100, an experimental setup with wideband signal generation and analysis bandwidth (of more than 300 MHz) was used. This allowed for comparison between the performance of the conventional and the present digital predistortion system for a wide range of signal observation bandwidths. In the experimental setup shown in FIG. 3, an arbitrary waveform generator 310 (AWG) model 81180A from Agilent Technologies is used to generate intermediate frequency analog waveforms of the in-phase (I) and quadrature (Q) components of the test signal. These waveforms are modulated around the RF carrier frequency using the performance signal generator 315 (PSG) model E8267D from Agilent Technologies. The RF signal is then applied at the input of the device under test 317. The resulting output is first attenuated by attenuator 320 and then demodulated using a high speed oscilloscope 325 (MSO 9404A from Agilent Technologies). The signal obtained at the output of the oscilloscope as well as the digital waveforms downloaded into the AWG are processed using a MATLAB based algorithm to generate and apply the predistortion function 100, wherein the present digital predistortion function 10 and identification algorithm 80 are implemented within the data processing software. The ADC speed requirements are defined by setting (in the oscilloscope 325) the sampling rate of the PA's output signal.

Figure 4:
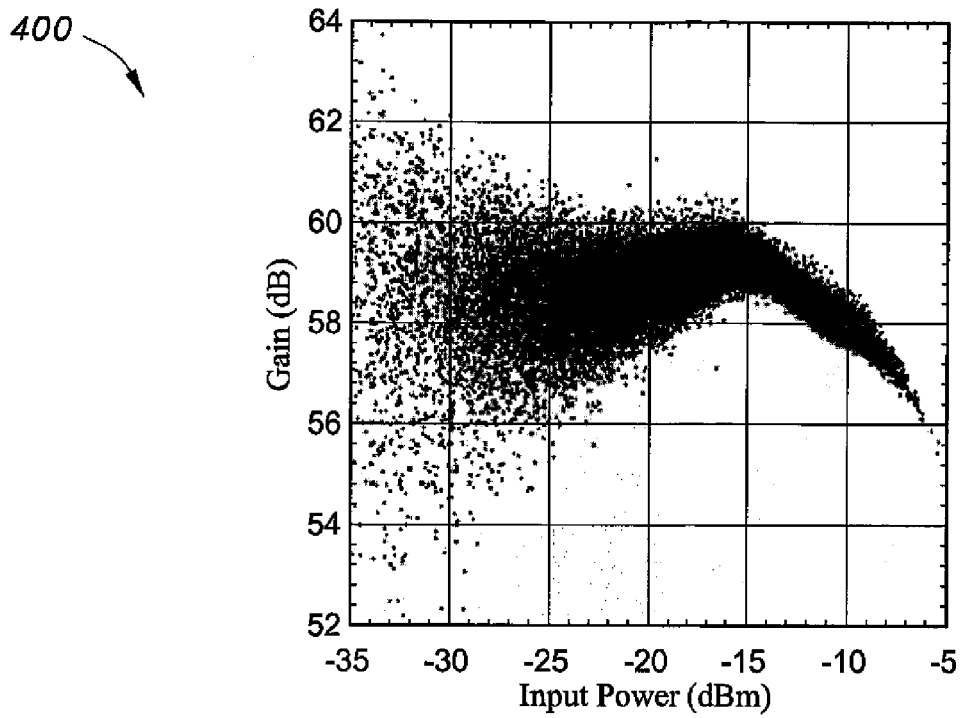
FIG. 4 is a plot showing AM/AM characteristics of the DUT.
Figure 5:
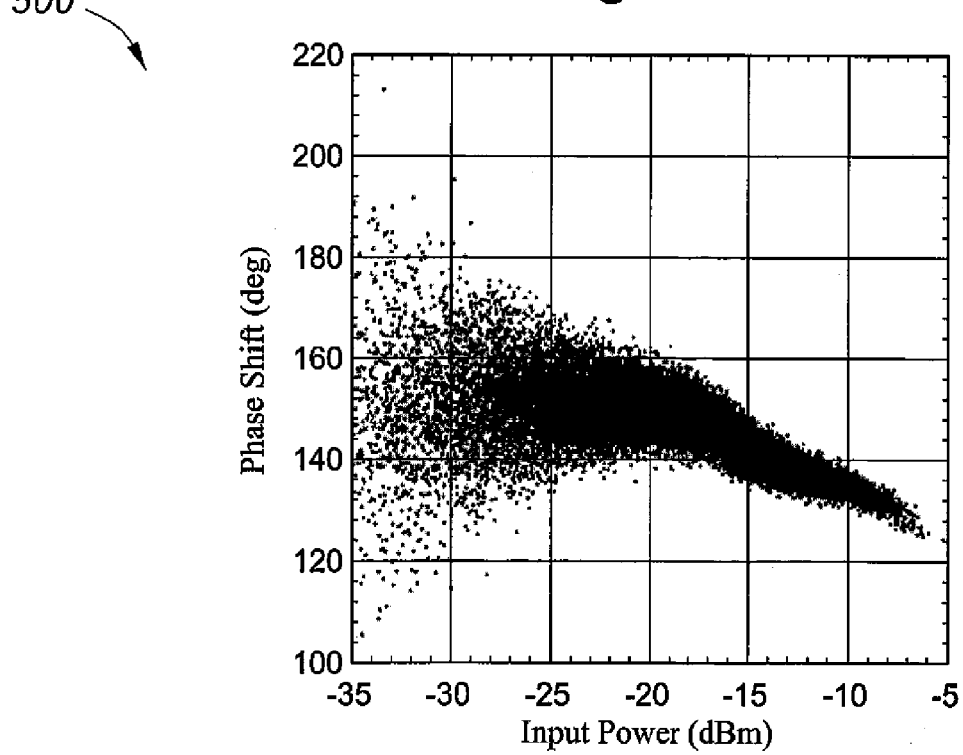
FIG. 5 is a plot showing AM/PM characteristic of the DUT.

The device under test 317 used in this work is a high power Doherty power amplifier designed for operation in the 2100 MHz frequency band (2110-2170 MHz). The measured AM/AM characteristic and AM/PM characteristic of the DUT driven by the 3-carrier LTE-A test signal are shown in plots 400 and 500 of FIGS. 4 and 5, respectively. The shapes of these characteristics reveal the highly nonlinear behavior of the DUT, and their dispersion exposes its strong memory effects.

Figure 6:
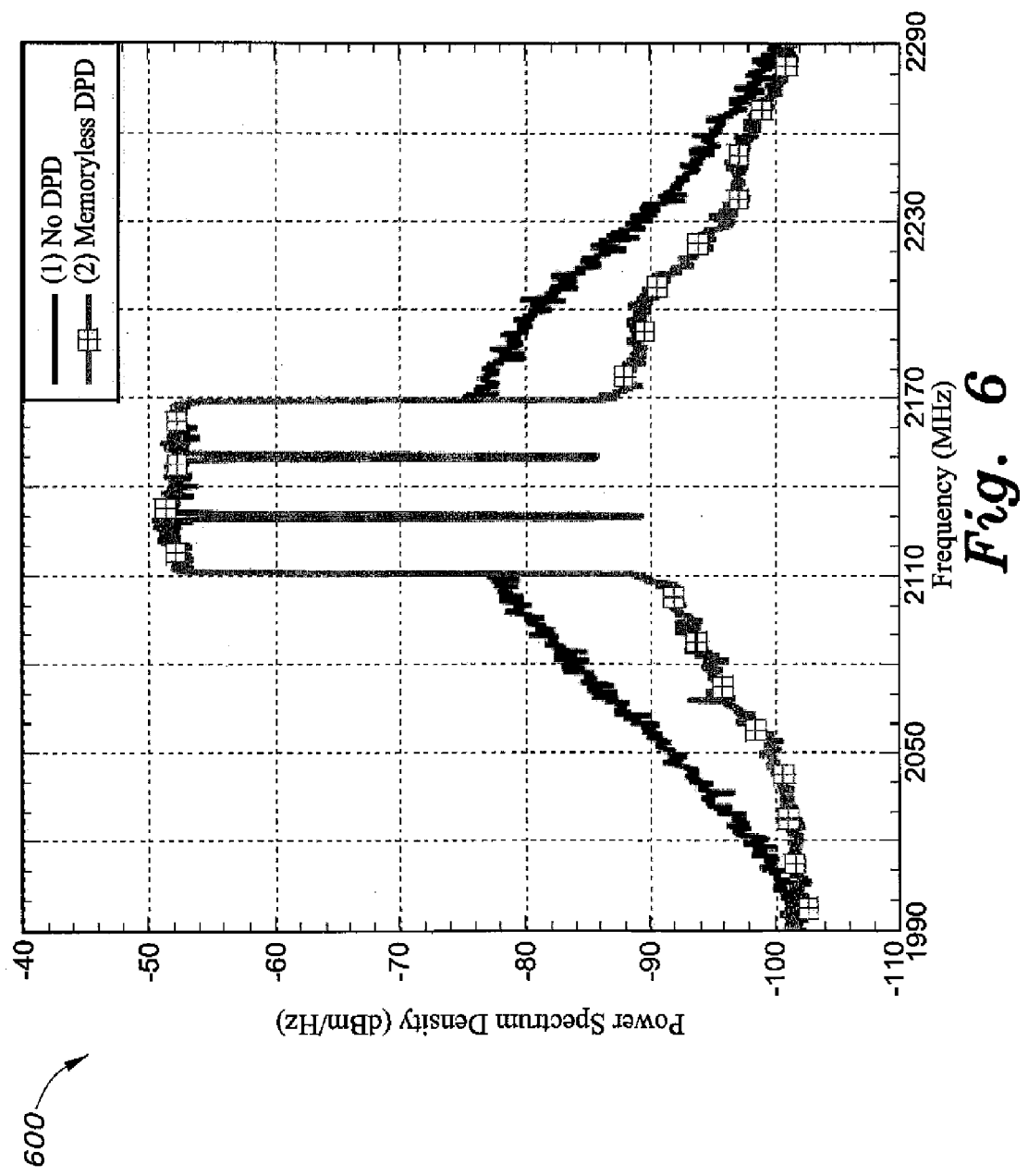
FIG. 6 is a plot showing sample spectra at the output of a PA linearized using memoryless predistortion.
Figure 7:
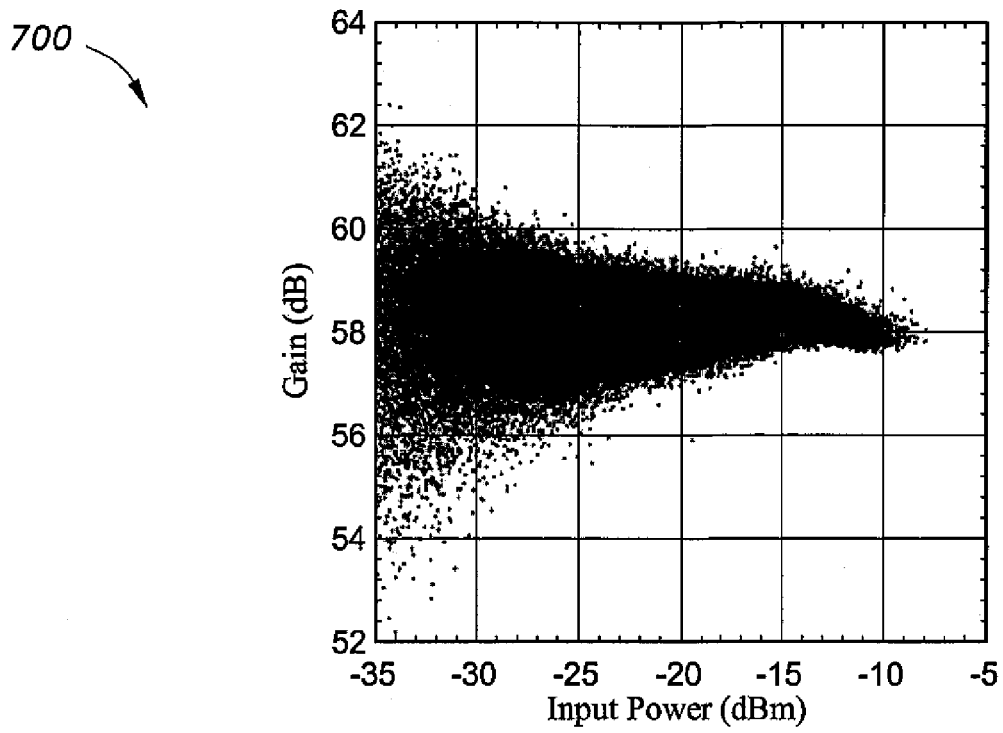
FIG. 7 is a plot showing AM/AM characteristic of the memoryless DPD+DUT cascade according to the present invention.
Figure 8:
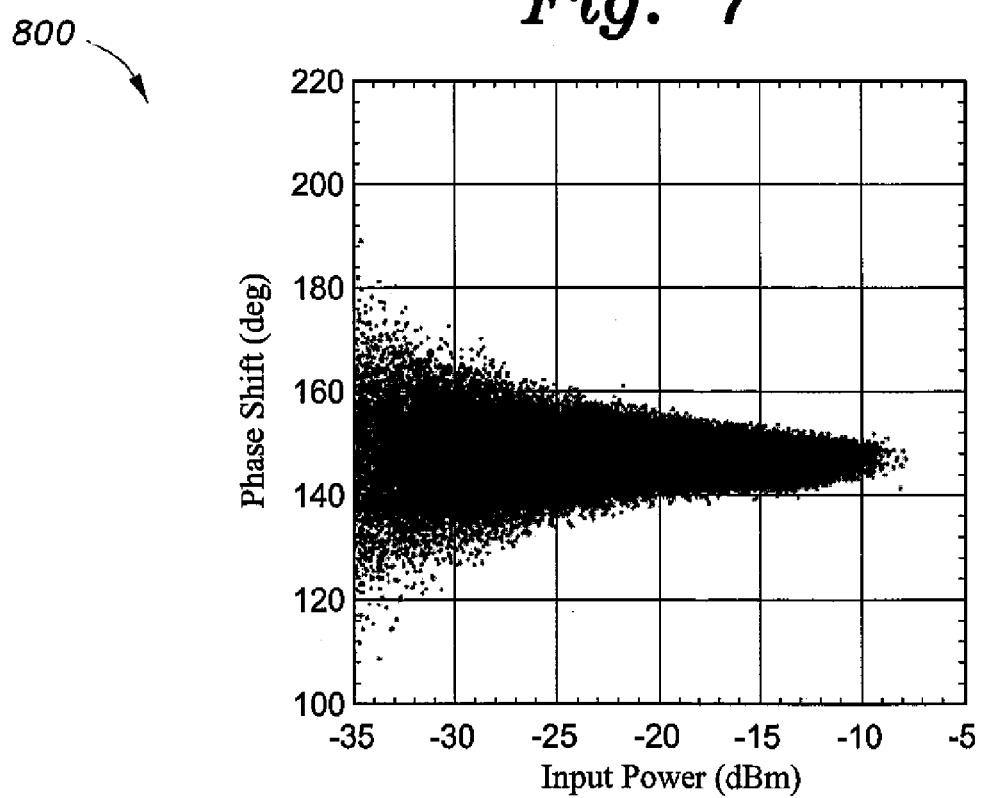
FIG. 8 is a plot showing AM/PM characteristic of the memoryless DPD+DUT cascade according to the present invention.

To experimentally confirm the fact that use of a memoryless DPD will reduce the bandwidth requirements of the signal observation path, a memoryless DPD was derived from narrow band measurement of the DUT 317. In this test, the signal bandwidth was set to 20 MHz, and accordingly the bandwidth of the signal observation path was set to 100 MHz. The measurement data was used to generate a look-up table based (LUT) memoryless DPD of the DUT. This LUT was then applied to linearize the DUT driven by the 60 MHz 3-carrier LTE-signal centered around 2140 MHz. The measured spectra at the output of the DUT with and without static predistortion are shown in plot 600 of FIG. 6 where it is clearly shown that the use of the memoryless predistorter significantly reduces the spectrum regrowth in the frequency range corresponding to the fifth order inter-modulation distortions (that is from 1990 MHz to 2050 MHz, and from 2230 MHz to 2290 MHz). To further corroborate this, the AM/AM and AM/PM characteristics of the cascade made of the static DPD and the DUT were measured. These plots 700 and 800 of FIGS. 7 and 8, respectively, confirm that the cascade made of the static DPD and the DUT (blocks 30, 40, 50 and 60 of FIG. 1) is a mildly nonlinear dynamic system. Indeed, the nonlinearity of these characteristics has been significantly removed as compared to their versions reported in FIGS. 4 and 5, while the memory effects remain quasi unchanged as it can be observed through the dispersion of these characteristics.

As a conclusion, these results confirm that the use of the static DPD cancels out most of the nonlinearity exhibited by the DUT. Consequently, it reduces the bandwidth of the signal at the output of the PA. As a result, a lower sampling rate can be used in the signal observation path.

To evaluate the effectiveness of the present digital predistortion system with extended correction bandwidth 100 in extending the bandwidth of digital predistortion systems, the DUT was linearized using the bandwidth extended DPD (BE- DPD) system as well as conventional DPD (C-DPD) system. For fair comparison, in both cases, the structure of the DPD and its parameters were the same. In fact, the memoryless digital predistortion function was built using a look-up table while the dynamic nonlinear predistortion function was implemented using a memory polynomial function with a nonlinearity order of 5 and a memory depth of 10.

Both the conventional and the present digital predistortion systems were experimentally validated for a wide range of signal observation bandwidths. In the C-DPD system, both static and dynamic predistortion functions are derived for each signal observation bandwidth. Conversely, for the present BE-DPD, the static nonlinear predistortion function is derived from narrow band measurement as described supra and maintained unchanged during all tests. However, the dynamic predistortion function is derived for each of the considered signal observation bandwidths.

Figure 9:
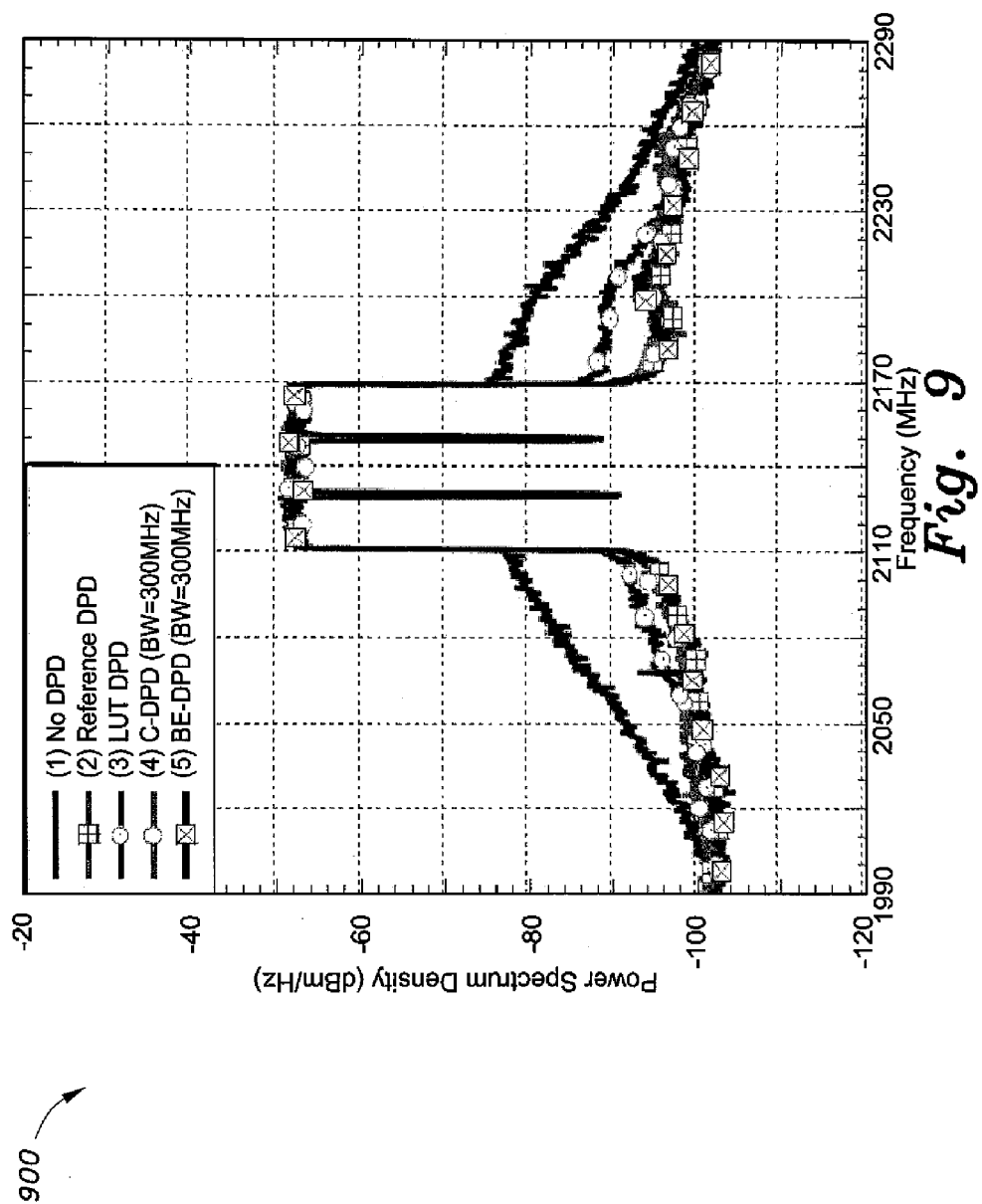
FIG. 9 is a plot showing measured spectra at the output of the linearized DUT using 300 MHz observation bandwidth.
Figure 10:
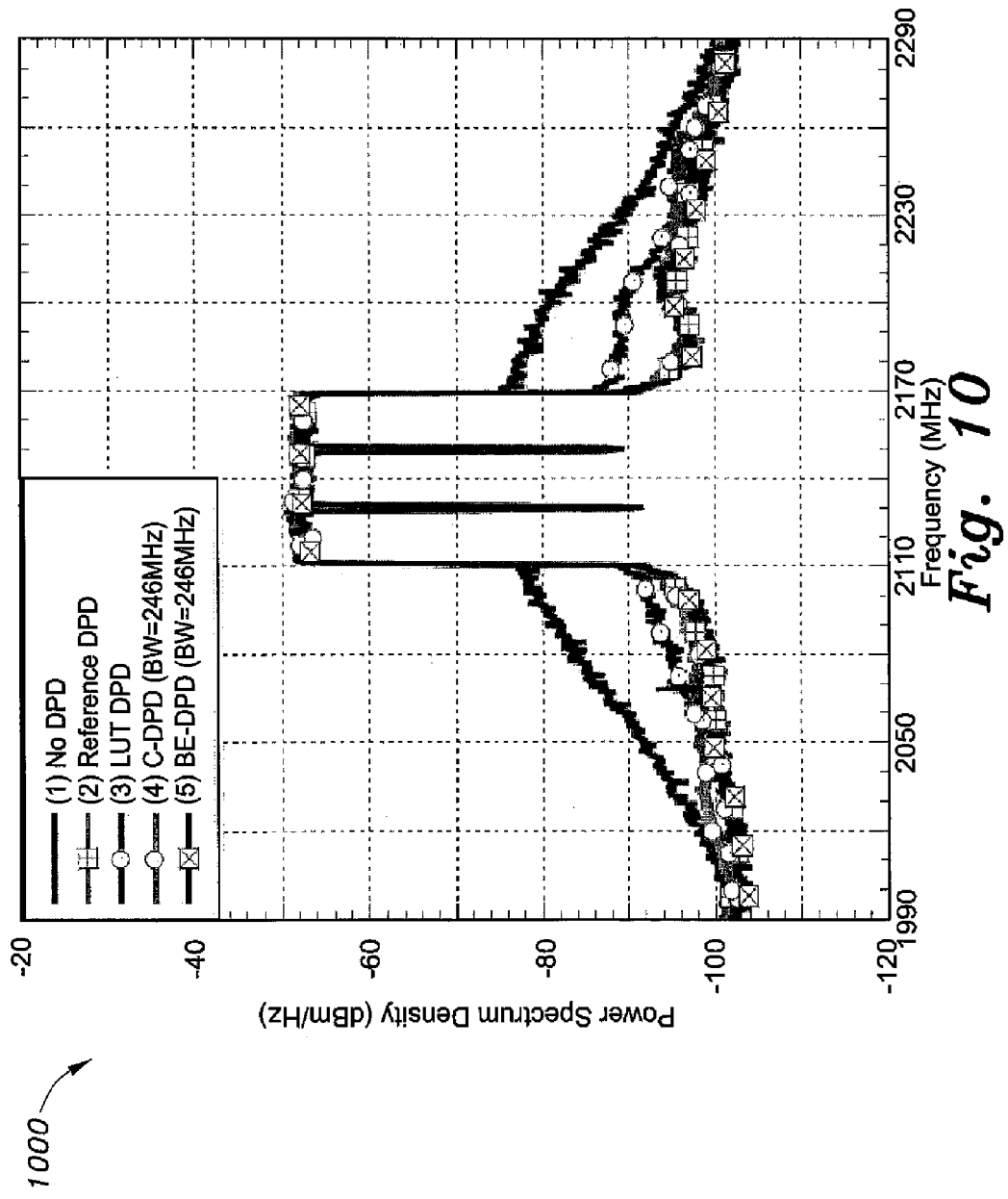
FIG. 10 is a plot showing measured spectra at the output of the linearized DUT using C-DPD and BE DPD for 246 MHz observation bandwidth.

Plot 900 of FIG. 9 shows the spectra measured at the output of the linearized DUT using both techniques when the signal observation bandwidth is large enough to include the complete third and fifth order intermodulation products. This figure shows that, as expected, both the C-DPD and the BE-DPD lead to the same quality of linearization.

Figure 11:
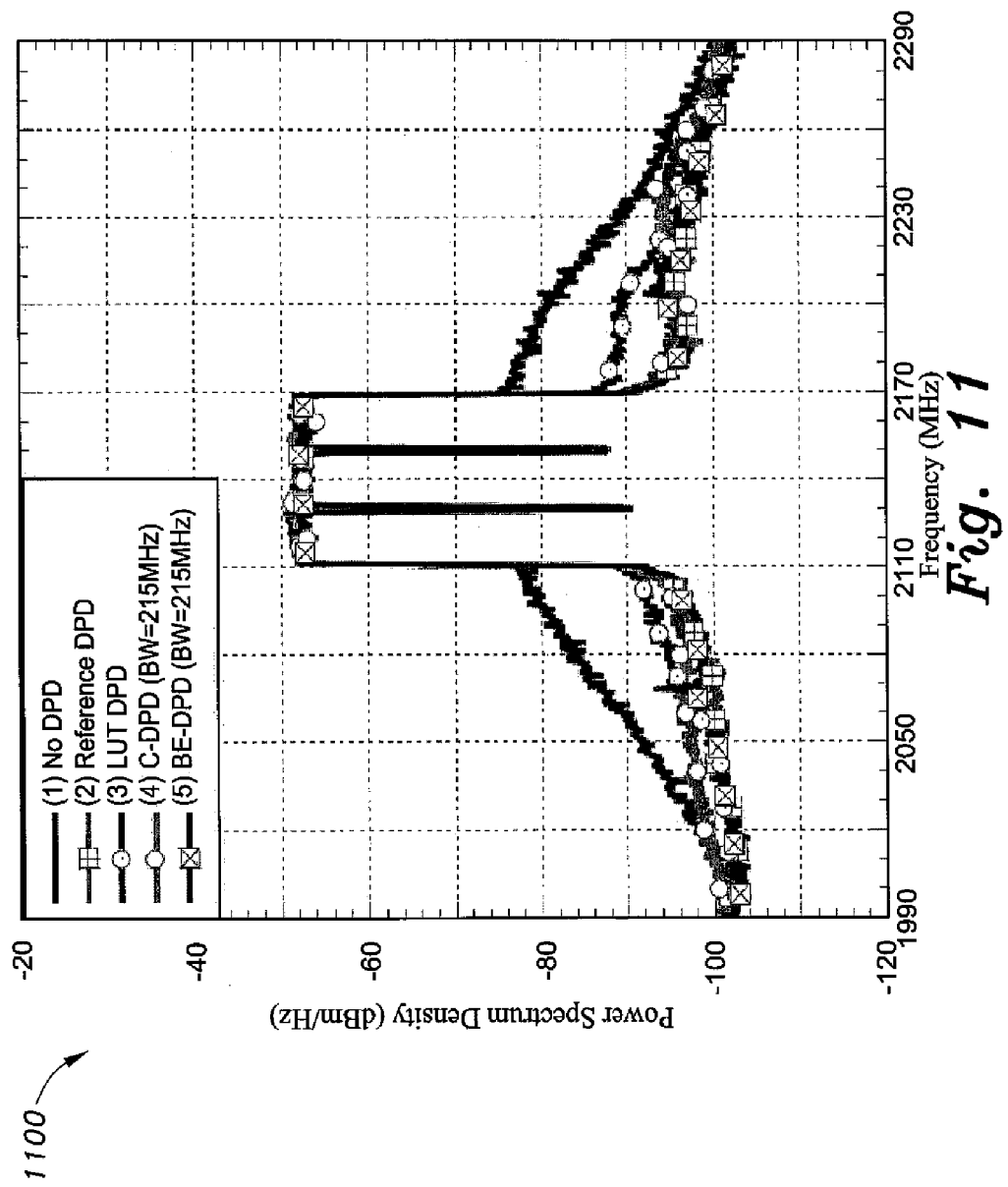
FIG. 11 is a plot showing measured spectra at the output of the linearized DUT using C-DPD and BE DPD for 215 MHz observation bandwidth.
Figure 12:
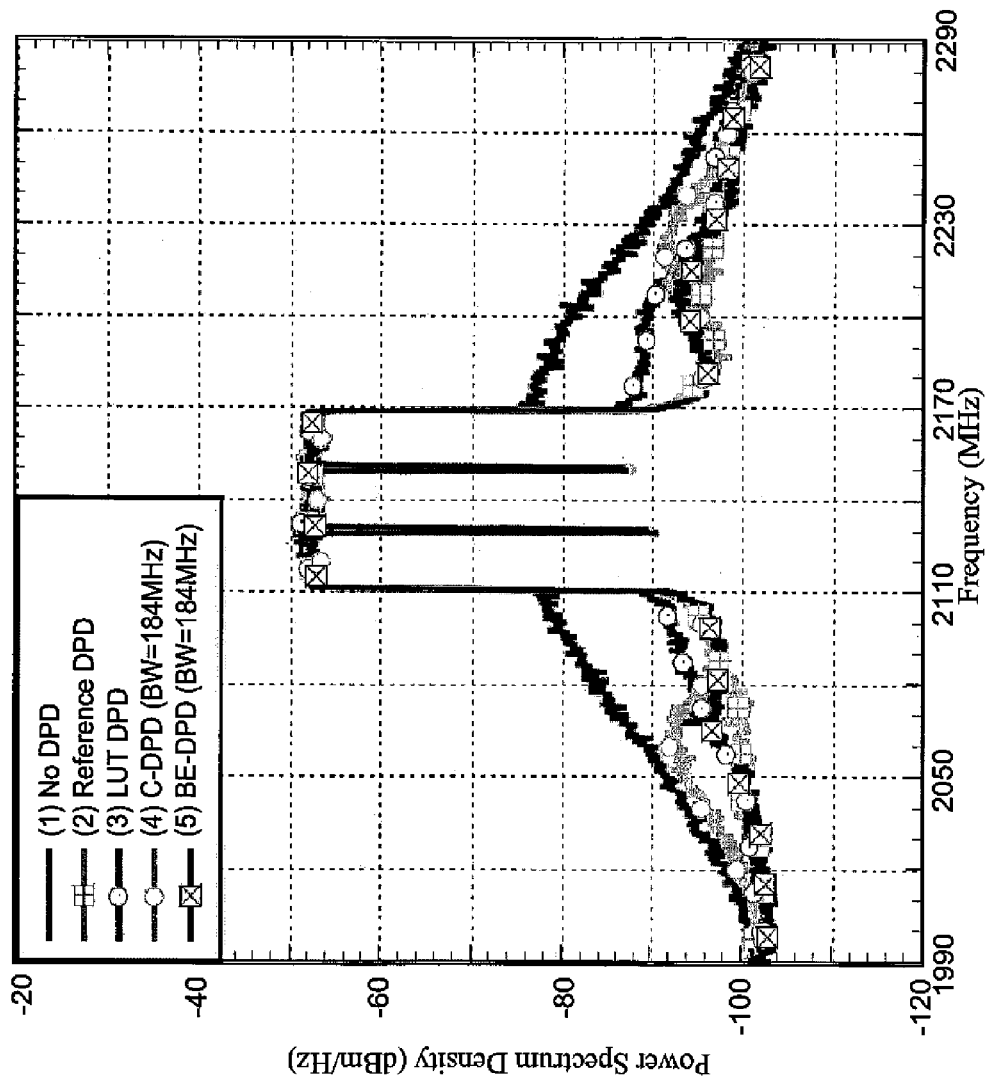
FIG. 12 is a plot showing measured spectra at the output of the linearized DUT using C-DPD and BE DPD for 184 MHz observation bandwidth.

The performances obtained for reduced signal observation bandwidth are presented as plots 1000, 1100, 1200, and 1300 in FIGS. 11 through 13, respectively. These plots show that even if the observation bandwidth is reduced down to 215 MHz, the performance of the present BE-DPD remains unaffected. Conversely, for the same signal observation bandwidths, the performance of the C-DPD gradually degrades. From these measurements, it appears that the BE-DPD can maintain a correction bandwidth of 300 MHz even if the signal observation bandwidth is reduced to 215 MHz. This represents approximately 28% reduction of the necessary observation bandwidth required for C-DPD. In other words, the BE-DPD correction bandwidth can be up to 40% wider than the signal observation bandwidth since an observation bandwidth of 215 MHz was enough to linearize the DUT over a 300 MHz bandwidth.

Then, the observation bandwidth was further reduced gradually down to 154 MHz. The spectra presented in FIGS. 12 and 13 show that the performance of the C-DPD and BE-DPD are affected. Here, it is essential to note that even under such conditions; the performances of the present BE-DPD remain superior to that of the C-DPD. In fact, the degradation of the BE-DPD performance is upper bounded by the performance of the LUT DPD. This means that as the observation bandwidth is reduced, the BE-DPD performance will converge to that of the LUT DPD. This contrasts with the C-DPD case for which the spectrum regrowth in the frequency range outside the signal observation bandwidth is similar to that obtained without DPD. These results are further corroborated with the spectra plot 1400 of FIG. 14 which was measured for a signal observation bandwidth of 123 MHz.

In conclusion, a bandwidth extended digital predistortion system is proposed. This system is based on a two-box digital predistorter architecture in which the static predistortion function is derived offline under narrow band test conditions and a memory polynomial DPD is then applied to linearize the cascade made of the static DPD and the device under test. The use of the static DPD was shown to reduce the spectrum regrowth at the output of the linearized DUT which in turn reduces the observation bandwidth requirements needed for the synthesis of the memory polynomial predistortion function. Experimental results using a 3-carrier LTE-A signal demonstrated the ability of the proposed BE-DPD in achieving satisfactory linearity performance over a 300 Mz bandwidth with an observation bandwidth of only 215 MHz.

It is to be understood that the present invention is not limited to the embodiments described above, but encompasses any and all embodiments within the scope of the following claims.

I claim:
1. A digital predistortion system with extended correction bandwidth, comprising:
  a dynamic nonlinear predistorter block having an input accepting an input signal to be predistorted, and an output;
  a memoryless, offline determinable, nonlinear predistorter block having an input, an output, and a select input, the dynamic nonlinear predistorter block output being connected to the input of the memoryless, offline determinable, nonlinear predistorter block;
  a memoryless nonlinearity selector block having an input and an output, the dynamic nonlinear predistorter block output being connected to the memoryless nonlinearity selector block's input, output of the selector block being connected to the select input of the memoryless, offline determinable, nonlinear predistorter block, the selector block selecting a single memoryless predistortion function based on the input signal's average power, the output of the memoryless nonlinear predistorter block comprising a digital output signal derived from the selected memoryless predistortion function;
  a digital-to-analog converter (DAC) having an analog output, and an input that accepts the digital output signal of the memoryless nonlinear predistorter block;
  a frequency up-conversion stage (UCS) having an output, and an input that accepts the DAC output;
  a power amplifier (PA) having an output, and an input that accepts the UCS output;
  a feedback path carrying signal characteristics of the power amplifier output, wherein said feedback path has a reduced bandwidth due to application of the memoryless DPD function to the PA;
  a down-conversion stage (DCS) having an input accepting a portion of the power amplifier output signal characteristics, and an output;
  an analog-to-digital-converter (ADC) having an input connected to the DCS output;
  a processor running a DPD coefficients identification algorithm, the processor accepting output from the dynamic nonlinear block and output of the ADC for processing by the DPD coefficients identification algorithm, the processor outputting DPD coefficients, as determined by the DPD coefficients identification algorithm, to the dynamic nonlinear block, wherein a function of the dynamic nonlinear digital predistorter based on the identified DPD coefficients is applied to the input signal being transmitted, the PA being linearized by the memoryless DPD function and the dynamic nonlinear DPD function.

2. The digital predistortion system with extended correction bandwidth according to claim 1, wherein the output signal ($x_{interm}$) of the dynamic nonlinear predistorter block is characterized by the relation, $$x_{interm}(i) = \sum_{n=0}^{N} \sum_{m=0}^{M} a_{nm} x(i-m) |x(i-m)|^n,$$

where N and M are the nonlinearity order and the memory depth of the memory polynomial function used to implement the dynamic nonlinearity of the predistorter, respectively.

3. The digital predistortion system with extended correction bandwidth according to claim 1, wherein the output signal ($x_{interm}$) of the dynamic nonlinear predistorter block is characterized by the relation, $$x_{interm}(i) = \sum_{n=0}^{N} \sum_{m=0}^{M} a_{nm} x(i) |x(i-m)|^n,$$

where N and M are the nonlinearity order and the memory depth of the memory polynomial function used to implement the dynamic nonlinearity of the predistorter, respectively.

4. The digital predistortion system with extended correction bandwidth according to claim 1, wherein the output signal ($x_{interm}$) of the dynamic nonlinear predistorter block is characterized by the relation, $$x_{interm}(i) = \sum_{n=0}^{N} \sum_{m=0}^{M} a_{nm} x(i-m) |x(i-m)|^n + \sum_{n=1}^{N_e} \sum_{m=1}^{M_e} b_{nm} x(i) |x(i-m)|^n,$$

where N and M are the nonlinearity order and the memory depth of the first term of the memory polynomial function used to implement the dynamic nonlinearity of the predistorter, respectively, $N_e$ and $M_e$ are the nonlinearity order and the memory depth of the second term of the memory polynomial function used to implement the dynamic nonlinearity of the predistorter, respectively.

5. The digital predistortion system with extended correction bandwidth according to claim 1, wherein the output signal ($x_{interm}$) of the dynamic nonlinear predistorter block is characterized by the relation, $$x_{interm}(i) = \sum_{n=0}^{N} \sum_{m=0}^{M} a_{nm} x(i-m) |x(i-m)|^n +$$

$$\sum_{n=1}^{N_b} \sum_{m=0}^{M_b} \sum_{p=1}^{P} b_{nmp} x(i-m) |x(i-m-p)|^n +$$

$$\sum_{n=1}^{N_c} \sum_{m=0}^{M_c} \sum_{q=1}^{Q} c_{nmq} x(i-m) |x(i-m+q)|^n,$$

where N and M are the nonlinearity order and the memory depth of the first term of the memory polynomial function used to implement the dynamic nonlinearity of the predistorter, respectively, $N_b$ and $M_b$ are the nonlinearity order and the memory depth of the second term of the memory polynomial function used to implement the dynamic nonlinearity of the predistorter, respectively, $N_c$ and $M_c$ are the nonlinearity order and the memory depth of the third term of the memory polynomial function used to implement the dynamic nonlinearity of the predistorter, respectively, P and Q are the orders of the lagging and leading cross-terms of the memory polynomial function used to implement the dynamic nonlinearity of the predistorter, respectively.

6. The digital predistortion system with extended correction bandwidth according to claim 1, wherein the digital output signal ($x_{out\_DPD}$) of the memoryless nonlinear predistorter is characterized by the relation, $$x_{out\_DPD}(i) = \sum_{k=0}^{K} b_k x_{interm}(i) |x_{interm}(i)|^k,$$

where K refers to the nonlinearity order of the memoryless nonlinear predistorter-block.

7. The digital predistortion system with extended correction bandwidth according to claim 1, wherein the digital output signal ($x_{out\_DPD}$) of the memoryless nonlinear predistorter is characterized by the relation, $$x_{out\_DPD}(i) = x_{interm}(i) \cdot G(|x_{interm}(i)|),$$

where G refers to the complex gain of the memoryless nonlinear predistorter-block.

8. The digital predistortion system with extended correction bandwidth according to claim 1, wherein bandwidth at the DAC is five times the bandwidth of a signal fed to the dynamic nonlinear predistorter block.

9. A digital predistortion method, comprising the steps of:
applying an input signal to a dynamic nonlinear predistorter;
providing via feedback path a characterization of an output signal of a power amplifier (PA);
up-sampling a digital output of said PA output signal characterization;
identifying DPD coefficients of the dynamic nonlinear digital predistorter which is disposed in-line upstream from a cascade comprising a memoryless, offline determinable, nonlinear predistorter and the PA, said DPD coefficients identifying step utilizing as inputs the up-sampled digital output of the PA output signal characterization and an output of the dynamic nonlinear digital predistorter, the up-sampled digital output of the PA output signal characterization and an input signal provided to the offline determinable, nonlinear predistorter being time aligned;
feeding the dynamic nonlinear digital predistorter DPD coefficients back to the dynamic nonlinear digital predistorter;
applying to the input signal a function of the dynamic nonlinear digital predistorter DPD based on the identified DPD coefficients;
applying the output of the dynamic nonlinear digital predistorter to the memoryless, offline determinable, nonlinear predistorter, said memoryless, offline determinable, nonlinear predistorter having an output based on a memoryless nonlinear function stored in the memoryless, offline determinable, nonlinear predistorter;
applying the memoryless, offline determinable, nonlinear predistorter output to the power amplifier (PA) at a bandwidth that is five times a bandwidth of the input signal provided to the dynamic nonlinear predistorter, wherein the feedback path has a reduced bandwidth and the PA is linearized by the memoryless DPD function and the dynamic nonlinear DPD function.

10. The digital predistortion method according to claim 9, further comprising the step of selecting the memoryless nonlinear function based on the input signal's average power.

11. The digital predistortion method according to claim 9, wherein a digital output signal ($x_{out\_DPD}$) of the memoryless, offline determinable, nonlinear predistorter is characterized by the relation, $$x_{out\_DPD}(i) = \sum_{k=0}^{K} b_k x_{interm}(i) |x_{interm}(i)|^k,$$

where K refers to the nonlinearity order of the memoryless nonlinear function.

12. The digital predistortion method according to claim 9, wherein a digital output signal ($x_{out\_DPD}$) of the memoryless nonlinear predistorter is characterized by the relation, $$x_{out\_DPD}(i) = x_{interm}(i) \cdot G(|x_{interm}(i)|),$$

where G refers to the complex gain of the memoryless nonlinear predistorter-block.

13. The digital predistortion method according to claim 9, wherein an output signal ($x_{interm}$) of the dynamic nonlinear predistorter is characterized by the relation, $$x_{interm}(i) = \sum_{n=0}^{N} \sum_{m=0}^{M} a_{nm} x(i-m)|x(i-m)|^n,$$

where N and m are the nonlinearity order and the memory depth of the memory polynomial function used to implement the dynamic nonlinearity of the predistorter, respectively.

14. The digital predistortion method according to claim 9, wherein an output signal ($x_{interm}$) of the dynamic nonlinear predistorter is characterized by the relation, $$x_{interm}(i) = \sum_{n=0}^{N} \sum_{m=0}^{M} a_{nm} x(i)|x(i-m)|^n,$$

where N and M are the nonlinearity order and the memory depth of the memory polynomial function used to implement the dynamic nonlinearity of the predistorter, respectively.

15. The digital predistortion method according to claim 9, wherein an output signal ($x_{interm}$) of the dynamic nonlinear predistorter is characterized by the relation, $$x_{interm}(i) = \sum_{n=0}^{N} \sum_{m=0}^{M} a_{nm} x(i-m)|x(i-m)|^n + \sum_{n=1}^{N_e} \sum_{m=1}^{M_e} b_{nm} x(i)|x(i-m)|^n,$$

where N and M are the nonlinearity order and the memory depth of the first term of the memory polynomial function used to implement the dynamic nonlinearity of the predistorter, respectively, $N_e$ and $M_e$ are the nonlinearity order and the memory depth of the second term of the memory polynomial function used to implement the dynamic nonlinearity of the predistorter, respectively.

16. The digital predistortion method according to claim 9, wherein an output signal ($x_{interm}$) of the dynamic nonlinear predistorter is characterized by the relation, $$x_{interm}(i) = \sum_{n=0}^{N} \sum_{m=0}^{M} a_{nm} x(i-m)|x(i-m)|^n +$$

$$\sum_{n=1}^{N_b} \sum_{m=0}^{M_b} \sum_{p=1}^{P} b_{nmp} x(i-m)|x(i-m-p)|^n +$$

$$\sum_{n=1}^{N_c} \sum_{m=0}^{M_c} \sum_{q=1}^{Q} c_{nmq} x(i-m)|x(i-m+q)|^n,$$

where N and M are the nonlinearity order and the memory depth of the first term of the memory polynomial function used to implement the dynamic nonlinearity of the predistorter, respectively, $N_b$ and $M_b$ are the nonlinearity order and the memory depth of the second term of the memory polynomial function used to implement the dynamic nonlinearity of the predistorter, respectively, $N_c$ and $M_c$ are the nonlinearity order and the memory depth of the third term of the memory polynomial function used to implement the dynamic nonlinearity of the predistorter, respectively, P and Q are the orders of the lagging and leading cross-terms of the memory polynomial function used to implement the dynamic nonlinearity of the predistorter, respectively.

\* \* \* \* \*